United States Patent
Hwang (10) Patent No.: US 11,595,597 B2
(45) Date of Patent: Feb. 28, 2023

(54) IMAGE SENSING DEVICE

(71) Applicant: SK hynix Inc., Icheon-si (KR)

(72) Inventor: Bo Kwang Hwang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/230,066

(22) Filed: Apr. 14, 2021

(65) Prior Publication Data

US 2022/0053151 A1 Feb. 17, 2022

(30) Foreign Application Priority Data

Aug. 13, 2020 (KR) .................. 10-2020-0101719

(51) Int. Cl.
| | | |
|---|---|---|
| H04N 5/351 | (2011.01) | |
| H04N 5/374 | (2011.01) | |
| H04N 5/355 | (2011.01) | |
| H04N 5/378 | (2011.01) | |
| H01L 27/146 | (2006.01) | |
| H04N 5/3745 | (2011.01) | |

(52) U.S. Cl.
CPC ....... *H04N 5/351* (2013.01); *H01L 27/14603* (2013.01); *H01L 27/14614* (2013.01); *H01L 27/14643* (2013.01); *H04N 5/3745* (2013.01)

(58) Field of Classification Search
CPC ...... H04N 5/351; H04N 5/3745; H04N 5/378; H04N 5/3559; H04N 5/37452; H04N 5/37457; H01L 27/14603; H01L 27/14643; H01L 27/14614; H01L 27/14612; H01L 27/14641
See application file for complete search history.

(56) References Cited

U.S. PATENT DOCUMENTS

| | | | | |
|---|---|---|---|---|
| 10,536,652 | B2* | 1/2020 | Oh | ............... H04N 5/37457 |
| 11,114,482 | B2* | 9/2021 | Ma | ............... H01L 27/14612 |
| 2007/0013797 | A1* | 1/2007 | McKee | ............... H04N 3/14 |
| | | | | 348/308 |
| 2014/0078368 | A1* | 3/2014 | Komori | ............... H04N 5/3742 |
| | | | | 348/307 |
| 2018/0294297 | A1* | 10/2018 | Yun | ............... H04N 5/369 |
| 2019/0215471 | A1* | 7/2019 | Oh | ............... H04N 5/355 |
| 2021/0151485 | A1* | 5/2021 | Ma | ............... H01L 27/14612 |
| 2022/0102401 | A1* | 3/2022 | Kwag | ............... H01L 24/14612 |

FOREIGN PATENT DOCUMENTS

| | | |
|---|---|---|
| KR | 100230901 B1 | 11/1999 |
| KR | 20170041187 A | 4/2017 |

* cited by examiner

*Primary Examiner* — Marly S Camargo
(74) *Attorney, Agent, or Firm* — Perkins Coie LLP (57) ABSTRACT

An image sensing device includes a pixel array including a plurality of unit pixel blocks each including a plurality of unit image sensing pixels arranged in the pixel array and structured to convert light into photocharges. Each of the unit pixel blocks includes a first sub-pixel block including a first floating diffusion region structured to hold the photocharges and a plurality of unit image sensing pixels sharing the first floating diffusion region, and a conversion gain capacitor arranged adjacent to one side of the first sub-pixel block. The conversion gain capacitor includes an impurity region coupled to an input node that receives a conversion gain signal, and a gate structured to surround the impurity region and coupled to the first floating diffusion region to change a gain of the first floating diffusion region in response to a change in the conversion gain signal.

18 Claims, 6 Drawing Sheets

IMAGE SENSING DEVICE

CROSS-REFERENCE TO RELATED APPLICATION

This patent document claims the priority and benefits of Korean patent application No. 10-2020-0101719, filed on Aug. 13, 2020, which is incorporated by reference in its entirety as part of the disclosure of this patent document.

TECHNICAL FIELD

The technology and implementations disclosed in this patent document generally relate to an image sensing device.

BACKGROUND

An image sensing device is used in electronic devices to convert optical images into electrical signals. With the recent development of automotive, medical, computer and communication industries, the demand for highly integrated, higher-performance image sensors has been rapidly increasing in various electronic devices such as digital cameras, camcorders, personal communication systems (PCSs), video game consoles, surveillance cameras, medical micro-cameras, robots, etc.

SUMMARY

Various embodiments of the disclosed technology relate to an image sensing device capable of implementing low-illuminance and high-illuminance characteristics by adjusting a conversion gain.

In an embodiment of the disclosed technology, an image sensing device may include a pixel array including a plurality of unit pixel blocks each including a plurality of unit image sensing pixels arranged in the pixel array and structured to convert light into photocharges. Each of the unit pixel blocks may include a first sub-pixel block including a first floating diffusion region structured to hold the photocharges and a plurality of unit image sensing pixels sharing the first floating diffusion region, and a conversion gain capacitor arranged adjacent to one side of the first sub-pixel block. The conversion gain capacitor may include an impurity region coupled to an input node that receives a conversion gain signal, and a gate structured to surround the impurity region and coupled to the first floating diffusion region to change a gain of the first floating diffusion region in response to a change in the conversion gain signal.

In another embodiment of the disclosed technology, an image sensing device may include at least one photoelectric conversion element configured to generate photocharges by converting incident light, a floating diffusion region configured to store the photocharges generated by the at least one photoelectric conversion element, at least one transfer transistor configured to transfer the photocharges to the floating diffusion region based on a transmission signal, and a conversion gain capacitor coupled to the floating diffusion region to adjust capacitance associated with the floating diffusion region based on a conversion gain signal to switch between different conversion gain values. The conversion gain capacitor may include an impurity region configured to receive the conversion gain signal, and a gate structured to surround the impurity region and coupled to the floating diffusion region.

In another embodiment of the disclosed technology, an image sensing device may include a pixel array including a plurality of unit pixel blocks arranged in an array shape. Each of the unit pixel blocks may include a first sub-pixel block including a first floating diffusion (FD) region and a plurality of unit pixels sharing the first floating diffusion (FD) region, and a conversion gain capacitor disposed at one side of the first sub-pixel block in a first direction. The conversion gain capacitor may include a source/drain region coupled to an input node of a conversion gain signal, and a gate formed to surround the source/drain region, and coupled to the first floating diffusion (FD) region.

In another embodiment of the disclosed technology, an image sensing device may include at least one photoelectric conversion element configured to generate photocharges through conversion of incident light, a floating diffusion (FD) region configured to store the photocharges therein, at least one transfer transistor configured to transmit the photocharges to the floating diffusion (FD) region based on a transmission signal, and a conversion gain capacitor coupled to the floating diffusion (FD) region, and configured to change capacitance of the floating diffusion (FD) region based on a conversion gain signal. The conversion gain capacitor may include a source/drain region configured to receive the conversion gain signal, and a gate configured to surround the source/drain region, and coupled to the floating diffusion (FD) region.

It is to be understood that both the foregoing general description and the following detailed description of the disclosed technology are illustrative and explanatory and are intended to provide further explanation of the disclosure as claimed.

DETAILED DESCRIPTION

This patent document provides implementations and examples of an image sensing device and the disclosed features may be implemented to achieve one or more advantages in imaging applications. Some implementations of the disclosed technology suggest designs of an image sensing device which can implement low-illuminance and high-illuminance characteristics by adjusting a conversion gain.

Figure 1:
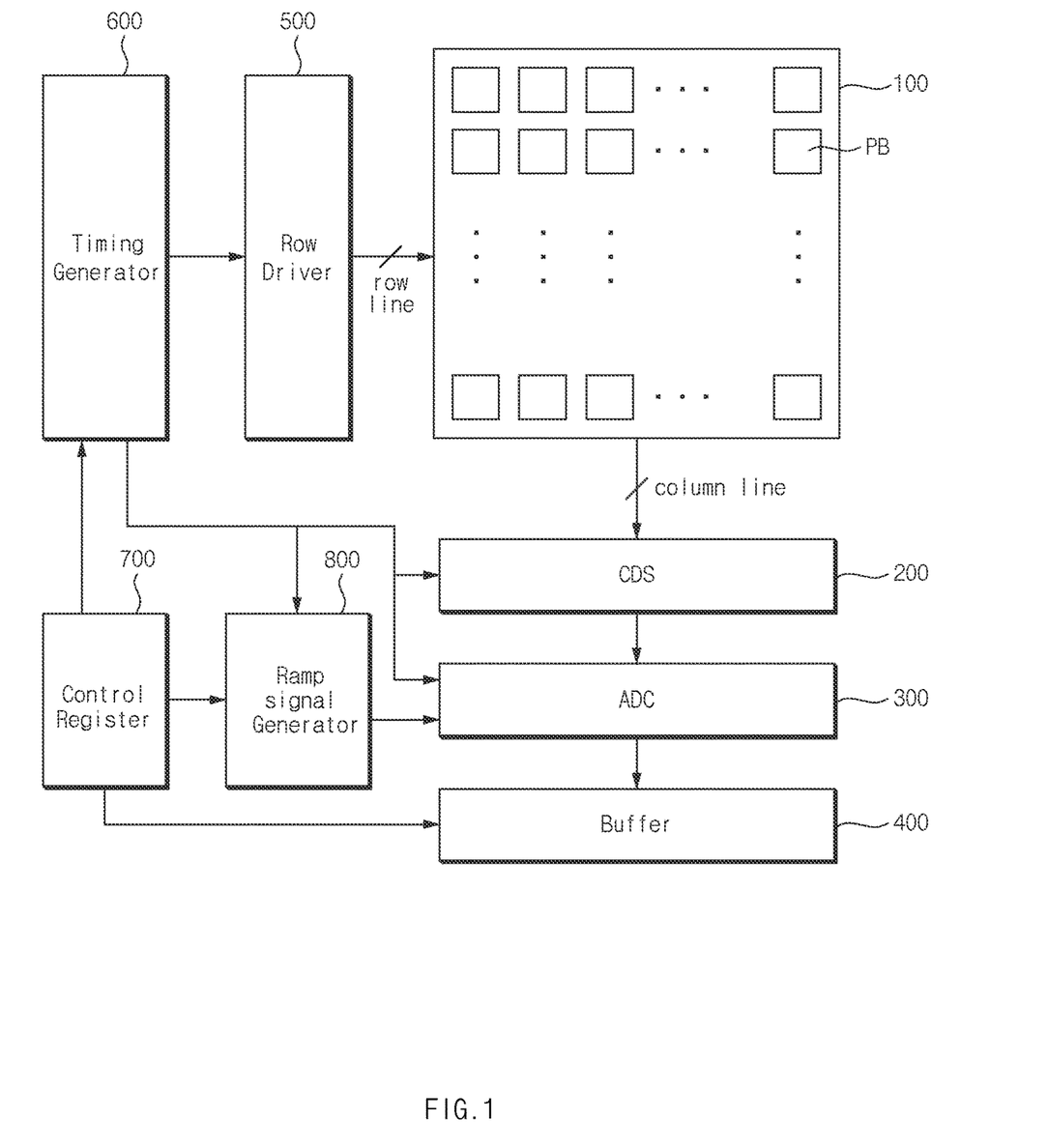
FIG. 1 is a schematic diagram illustrating an example layout of an image sensing device based on some implementations of the disclosed technology.

FIG. 1 is a block diagram illustrating an example of an image sensing device based on some implementations of the disclosed technology.

Referring to FIG. 1, the image sensing device may include a pixel array 100, a correlated double sampler (CDS) 200, an analog-to-digital converter (ADC) 300, a buffer 400, a row driver 500, a timing generator 600, a control register 700, and a ramp signal generator 800.

Figure 2:
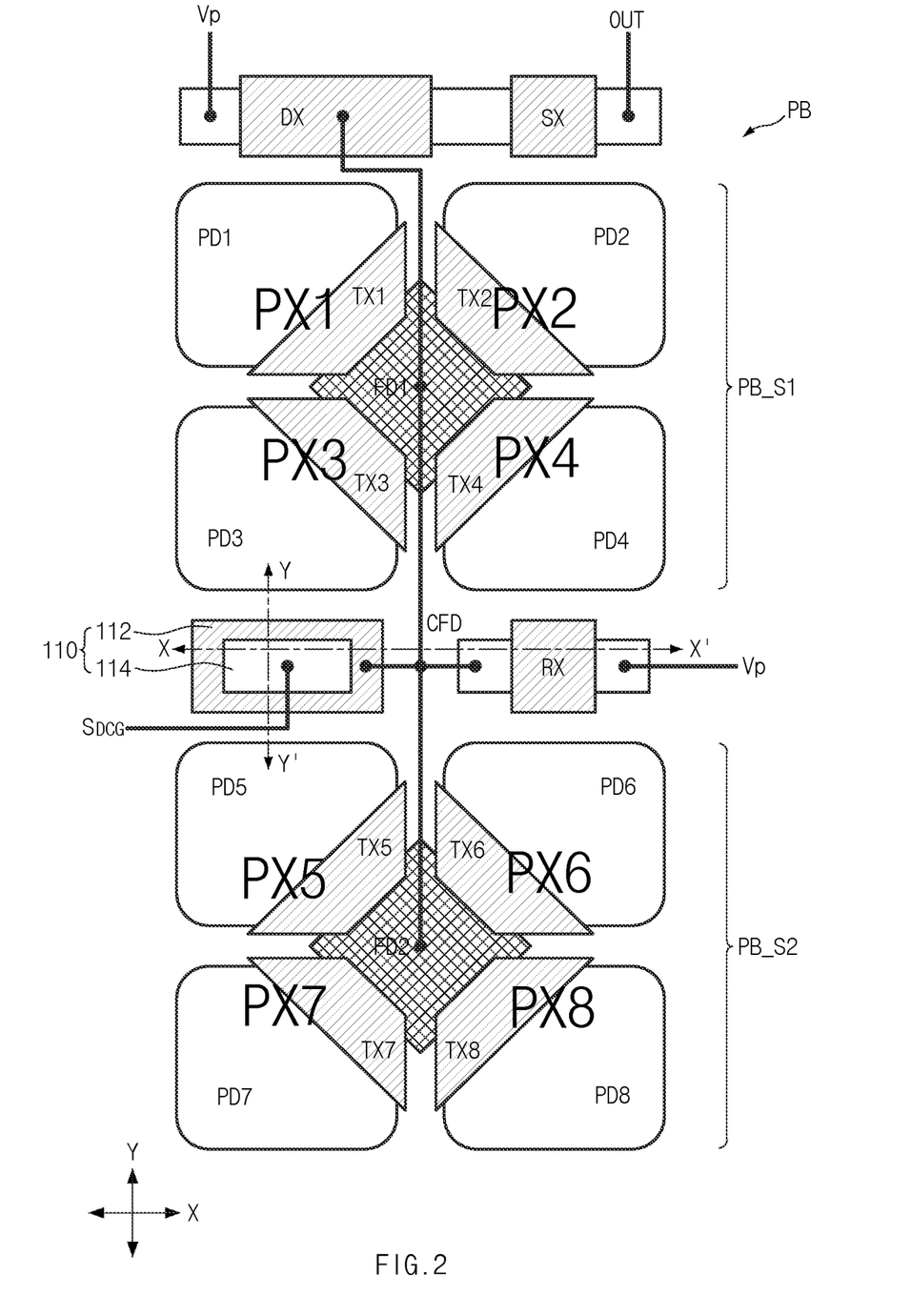
FIG. 2 is a layout diagram illustrating an example of a unit pixel block having an 8-shared pixel structure based on some implementations of the disclosed technology.
Figure 3:
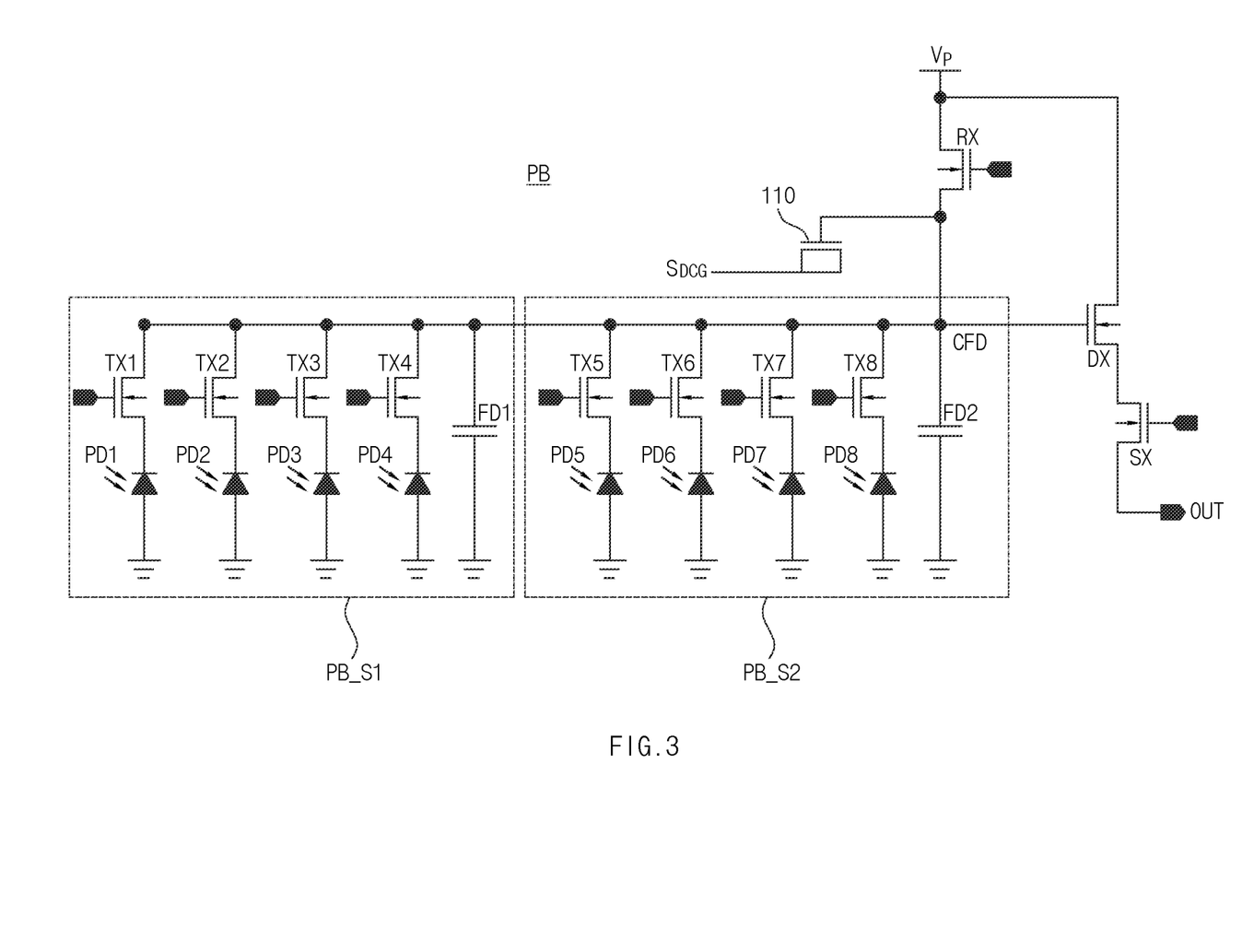
FIG. 3 is a circuit diagram illustrating an example of the unit pixel block shown in FIG. 2 based on some implementations of the disclosed technology.

The pixel array 100 may include a plurality of unit pixel blocks (PBs) arranged in a matrix shape including columns and rows. Each unit pixel block (PB) may include a plurality of unit pixels configured to share a floating diffusion region and pixel transistors with each other. For example, in some implementations, the unit pixel block (PB) may be formed as a multi-pixel structure in which multiple unit pixels share a common floating diffusion region that provides a pixel block readout of the photocharge generated in the multiple unit pixels of the unit pixel block PB, a reset transistor (RX), a source follower transistor (DX) that outputs the pixel block readout, and a selection transistor (SX) that selects the unit pixel block. The remaining unit pixels in the sensor are grouped and constructed similarly as pixel blocks where unit pixels in each pixel block share with common circuitry. Specifically, FIGS. 2 and 3 show an example where 8 adjacent unit pixels are grouped to form one unit pixel block PB, and four unit pixels among the 8 unit pixels in the PB share one floating diffusion region, and the remaining four unit pixels may share another floating diffusion region. Each unit pixel may include a photoelectric conversion element for generating photocharges through conversion of an incident optical signal received from the outside. Each unit pixel may include a transfer transistor for transmitting photocharges generated from the photoelectric conversion element to the floating diffusion region. Each unit pixel block (PB) may include a conversion gain capacitor to adjust a conversion gain. In this case, the conversion gain capacitor may include a metal-oxide-semiconductor (MOS) capacitor in which source and drain are formed as a single common junction and a gate is formed to surround the common junction, as will be discussed below. The unit pixel block (PB) may output pixel signals corresponding to electrical image signals of the unit pixels to the correlated double sampler (CDS) 200 through column lines.

As discussed above, each unit pixel PX may output the pixel signal to the correlated double sampler (CDS) 200. CMOS image sensors may use the correlated double sampling (CDS) to remove an undesired offset value of pixels by sampling a pixel signal twice to remove the difference between these two samples. In one example, the correlated double sampling (CDS) may remove the undesired offset value of pixels by comparing pixel output voltages obtained before and after a light signal is incident on the pixels so that only pixel output voltages based on the incident light can be measured. In some embodiments of the disclosed technology, the correlated double sampler (CDS) 200 may sequentially sample and hold voltage levels of the reference signal and the image signal, which are provided to each of a plurality of column lines from the pixel array 100. For example, the correlated double sampler (CDS) 200 may perform sampling of a reference voltage level and a voltage level of the received pixel signal in response to a clock signal received from the timing generator 600, and may transmit an analog signal corresponding to a difference between the reference voltage level and the voltage level of the received pixel signal to the analog-to-digital converter (ADC) 300.

The analog-to-digital converter (ADC) 300 may be used to convert analog CDS signals to digital signals. In some implementations, the ADC 300 may be implemented as a ramp-compare type ADC. The ramp-compare type ADC may include a comparator circuit for comparing the analog pixel signal with a reference signal such as a ramp signal that ramps up or down, and a timer counts until a voltage of the ramp signal matches the analog pixel signal. In some embodiments of the disclosed technology, the ADC 300 may convert the correlate double sampling signal generated by the CDS 200 for each of the columns into a digital signal, and output the digital signal. The ADC 300 may perform a counting operation and a computing operation based on the correlate double sampling signal for each of the columns and a ramp signal received from the ramp signal generator 800. In this way, the ADC 300 may eliminate or reduce noises such as reset noise arising from the imaging pixels when generating digital image data.

The ADC 300 may include a plurality of column counters. Each column of the pixel array 100 is coupled to a column counter, and image data can be generated by converting the correlate double sampling signals received from each column into digital signals using the column counter. In another embodiment of the disclosed technology, the ADC 300 may include a global counter to convert the correlate double sampling signals corresponding to the columns into digital signals using a global code provided from the global counter.

The buffer 400 may temporarily hold or latch each of the digital signals received from the analog-to-digital converter (ADC) 300, may sense or detect and amplify each of the digital signals, and may output each of the amplified digital signals. Therefore, the buffer 400 may include a memory (not shown) and a sense amplifier (not shown). The memory may store the count value, and the count value may be associated with output signals of the plurality of unit pixels PXs. The sense amplifier may sense and amplify each count value received from the memory.

The row driver 500 may be used to drive the pixel array 100 in response to an output signal of the timing generator 600. In some implementations, the row driver 500 may select one or more imaging pixels arranged in one or more rows of the pixel array 100. The row driver 500 may generate a row selection signal to select one or more rows among the plurality of rows. The row decoder 500 may sequentially enable the pixel reset signal for resetting imaging pixels corresponding to at least one selected row, and the transmission signal for the pixels corresponding to the at least one selected row.

The timing generator 600 may generate a timing signal to control the row driver 500, the correlated double sampler (CDS) 200, the analog-to-digital converter (ADC) 300, and the ramp signal generator 800.

The control register 700 may generate control signals to control the ramp signal generator 800, the timing generator 600, and the buffer 400.

The ramp signal generator 800 may generate a ramp signal in response to a control signal of the control register 700 and a timing signal received from the timing generator 600, and may output the ramp signal to the analog-to-digital converter (ADC) 300.

FIG. 2 is a layout diagram illustrating an example of a particular implementation of a unit pixel block (PB) having 8 adjacent unit pixels that form an 8-shared pixel structure based on some implementations of the disclosed technology. FIG. 3 is a circuit diagram illustrating an equivalent circuit of the unit pixel block (PB) shown in the specific example implementation in FIG. 2.

Referring to FIGS. 2 and 3, each unit pixel block (PB) may include a plurality of unit pixels PX1-PX8, a plurality of floating diffusion regions FD1 and FD2, a source follower transistor DX, a selection transistor SX, a reset transistor RX, and a conversion gain capacitor 110.

In some implementations, the conversion gain capacitor 110 may be an additional capacitor that is coupled to a floating diffusion region. The dual conversion gain capacitor can be used to adjust the conversion gain of the floating diffusion region. For example, an image sensing device can include a dual conversion gain capacitor that is selectively switched in and out of use to place corresponding image sensing pixels in a low gain mode or a high gain mode.

The unit pixels PX1, PX2, PX3, PX4, PX5, PX6, PX7, and PX8 may include photoelectric conversion elements PD1, PD2, PD3, PD4, PD5, PD6, PD7, and PD8, and transfer transistors TX1, TX2, TX3, TX4, TX5, TX6, TX7, and TX8, respectively. Here, each of the photoelectric conversion elements PD1-PD8 may generate photocharges in response to incident light. As illustrated in FIG. 2, four transfer transistors TX1-TX4 may transmit photocharges generated by the corresponding photoelectric conversion elements PD1-PD4 to their shared common floating diffusion region FD1 in response to a transmission (Tx) signal, and four transfer transistors TX5-TX8 may transmit photocharges generated by the corresponding photoelectric conversion elements PD5-PD8 to the floating diffusion region FD2 in response to a transmission (Tx) signal. The unit pixel PX1 may include the photoelectric conversion element PD1 and the transfer transistor TX1 that transmits photocharges generated by the photoelectric conversion element PD1 to the floating diffusion region FD1 in response to a transmission signal. The unit pixel PX2 may include the photoelectric conversion element PD2 and the transfer transistor TX2 that transmits photocharges generated by the photoelectric conversion element PD2 to the floating diffusion region FD1 in response to a transmission signal. The unit pixel PX3 may include the photoelectric conversion element PD3 and the transfer transistor TX3 that transmits the photocharges generated by the photoelectric conversion element PD3 to the floating diffusion region FD1 in response to a transmission signal. The unit pixel PX4 may include the photoelectric conversion element PD4 and the transfer transistor TX4 that transmits photocharges generated by the photoelectric conversion element PD4 to the floating diffusion region FD1 in response to a transmission signal. The unit pixel PX5 may include the photoelectric conversion element PD5 and the transfer transistor TX5 that transmits photocharges generated by the photoelectric conversion element PD5 to the floating diffusion region FD2 in response to a transmission signal. The unit pixel PX6 may include the photoelectric conversion element PD6 and the transfer transistor TX6 that transmits photocharges generated by the photoelectric conversion element PD6 to the floating diffusion region FD2 in response to a transmission signal. The unit pixel PX7 may include the photoelectric conversion element PD7 and the transfer transistor TX7 that transmits the photocharges generated by the photoelectric conversion element PD7 to the floating diffusion region FD2 in response to a transmission signal. The unit pixel PX8 may include the photoelectric conversion element PD8 and the transfer transistor TX8 that transmits the photocharges generated by the photoelectric conversion element PD8 to the floating diffusion region FD2 in response to a transmission signal.

Each of the photoelectric conversion elements PD1-PD8 may include a photodiode. In some implementations, each of the photoelectric conversion elements PD1-PD8 may include a P-type impurity region and an N-type impurity region. For example, each of the photoelectric conversion elements PD1-PD8 may be formed in a substrate by vertically stacking a P-type impurity region and an N-type impurity region.

Each of the floating diffusion regions FD1 and FD2 may be formed in an upper portion of the substrate. The floating diffusion region FD1 may temporarily store photocharges received through the transmission transistors TX1-TX4. The floating diffusion region FD2 may temporarily store photocharges received through the transmission transistors TX5-TX8. The floating diffusion region FD1 and the floating diffusion region FD2 may be coupled to each other through conductive lines (e.g., metal lines) to effectuate a single floating diffusion region for collecting photocharge generated by the photoelectric conversion elements PD1, PD2, PD3, PD4, PD5, PD6, PD7, and PD8 in the pixel block PB. In addition, the floating diffusion regions FD1 and FD2 may be coupled to a gate of the source follower transistor DX and a source/drain region of the reset transistor RX through conductive lines.

The transfer transistors TX1-TX4 may be coupled to the corresponding photoelectric conversion elements PD1-PD4 and the floating diffusion region FD1. The transfer transistors TX5-TX8 may be coupled to the corresponding photoelectric conversion elements PD5-PD8 and the floating diffusion region FD2. For example, one terminal of the transfer transistor TX1, TX2, TX3 or TX4 may be coupled to the photoelectric conversion element PD1, PD2, PD3 or PD4, and the other terminal of the transfer transistor TX1, TX2, TX3 or TX4 may be coupled to the floating diffusion region FD1. The transfer transistor TX1, TX2, TX3 or TX4 may transmit photocharges generated by the photoelectric conversion element PD1, PD2, PD3 or PD4 to the floating diffusion region FD1 in response to transmission signal applied to transfer gate. One terminal of the transfer transistor TX5, TX6, TX7 or TX8 may be coupled to the photoelectric conversion element PD5, PD6, PD7 or PD8, and the other terminal of the transfer transistor TX5, TX6, TX7 or TX8 may be coupled to the floating diffusion region FD2. The transfer transistor TX5, TX6, TX7 or TX8 may transmit photocharges generated by the photoelectric conversion element PD5, PD6, PD7 or PD8 to the floating diffusion region FD2 in response to transmission signal applied to transfer gate.

In some implementations, the plurality of unit pixels PX1-PX8 and the floating diffusion regions FD1 and FD2 may be arranged such that four unit pixels surround a floating diffusion region. In one example, unit pixels PX1-PX4 surround the floating diffusion region FD1 while being spaced apart from each other by a predetermined distance, and unit pixels PX5-PX8 surround the floating diffusion region FD2 while being spaced apart from each other by a predetermined distance.

In the following description, the floating diffusion region FD1 and four unit pixels PX1-PX4 surrounding the floating diffusion region FD1 are referred to as a sub-pixel block PB_S1, and the floating diffusion region FD2 and four unit pixels PX5-PX8 surrounding the floating diffusion region FD2 are referred to as a sub-pixel block PB_S2.

In some implementations, the unit pixel block (PB) may include the sub-pixel blocks PB_S1 and PB_S2 spaced apart from each other by a predetermined distance in a Y-axis direction. The sub-pixel blocks PB_S1 and PB_S2 may be arranged in the same (or similar) manner and have the same (or similar) size as one another.

In some implementations, the source follower transistor DX and the selection transistor SX are coupled to each other, and the source follower transistor DX is coupled to the floating diffusion FD regions FD1 and FD2. In one example, the source follower transistor DX and the selection transistor SX may be arranged adjacent to the sub-pixel block PB_S1 (e.g., along a side of the sub-pixel block PB_S1). In some implementations, the source follower transistor DX and the selection transistor SX may be coupled in series to each other and arranged in an X-axis direction as illustrated in FIG. 2 while sharing an active region. One terminal (e.g., a source or drain region) of the source follower transistor DX may be coupled to a pixel-voltage ($V_P$) node, and one terminal (e.g., a source or drain region) of the selection transistor SX may be coupled to an output node (OUT). In other words, the source follower transistor DX and the selection transistor SX may be coupled in series between the pixel-voltage ($V_P$) node and the output node (OUT). The gate of the source follower transistor DX may be coupled to the floating diffusion regions FD1 and FD2.

In some implementations, the reset transistor RX and the conversion gain capacitor 110 may be formed in a region different from the region in which the source follower transistor DX and the selection transistor SX are formed. In one example, the reset transistor RX and the conversion gain capacitor 110 may be arranged between the sub-pixel blocks PB_S1 and PB_S2 (e.g., along the other side of the sub-pixel block PB_S1). Here, the reset transistor RX and the conversion gain capacitor 110 may be spaced apart from each other by a predetermined distance in the X-axis direction. In one example, the reset transistor RX and the conversion gain capacitor 110 are isolated by a device isolation structure formed in a trench that is formed by etching of the substrate. In another example, the reset transistor RX and the conversion gain capacitor 110 may be isolated by an impurity region (e.g., a junction isolation structure) that is formed by implanting impurities into the substrate. Such a junction isolation structure may be used to isolate the conversion gain capacitor 110 from the reset transistor RX, the other transistors TX, DX, and SX, and the floating diffusion regions FD1 and FD2.

The conversion gain capacitor 110 may be formed to include a MOS capacitor. In some implementations, the conversion gain capacitor 110 may include one integrated impurity region (i.e., a doped semiconductor region similar to a source or drain region of a transistor) 114 and a gate 112 formed to surround the impurity region (source or drain region) 114. In one example, the gate 112 may be formed in a ring shape. In another example, the gate 112 may be formed in a rectangular ring shape.

In an example, source/drain regions of a MOS capacitor may be formed by electrically connecting, through conductive lines, the source/drain regions formed at both sides of the gate. In some implementations of the disclosed technology, the source/drain regions of the conversion gain capacitor 110 may be formed as a single integrated impurity region 114, and the gate 112 of the conversion gain capacitor 110 may have a ring shape that surrounds the integrated impurity region (source or drain region) 114. In this way, the MOS capacitor can be formed in a relatively smaller or narrower region as compared to the MOS capacitor that has source/drain regions at both sides of the gate.

Figure 4:
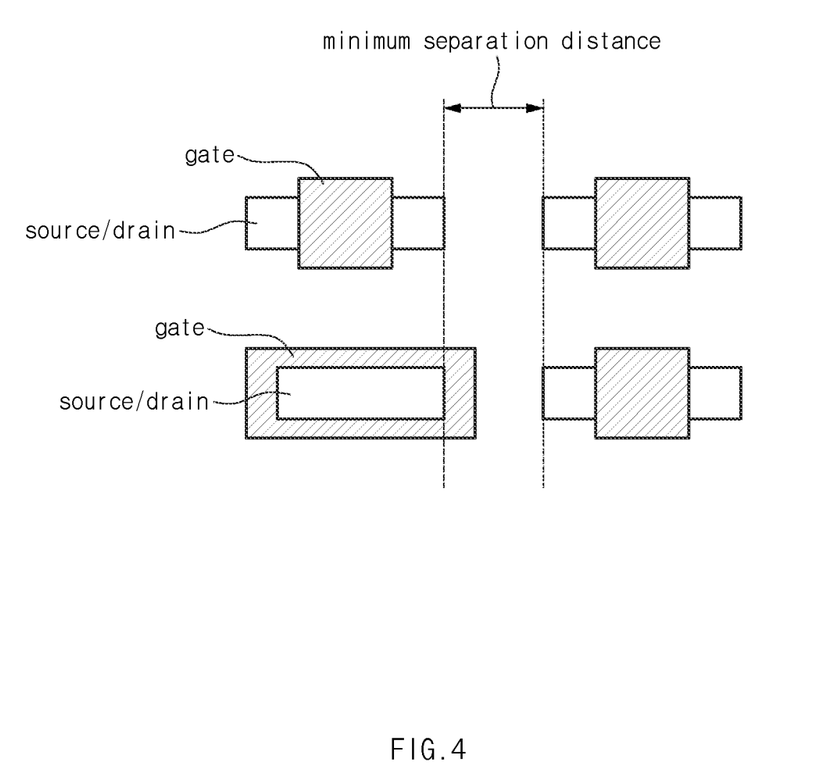
FIG. 4 is a schematic diagram illustrating an example metal oxide semiconductor (MOS) capacitor that includes source/drain regions at both sides of a gate, and another example MOS capacitor that includes a ring-shaped gate that surrounds a source/drain region implemented based on some implementations of the disclosed technology.

FIG. 4 is a schematic diagram illustrating an example MOS capacitor that includes source/drain regions at both sides of a gate, and another example MOS capacitor that includes a ring-shaped gate that surrounds a source/drain region implemented based on some implementations of the disclosed technology.

Referring to FIG. 4, for device isolation between adjacent devices, the distance between the adjacent devices should be sufficiently long. For example, source/drain regions of the adjacent transistors should be spaced apart from each other by at least a predetermined distance. In some implementations, the distance between the source/drain regions of the adjacent transistors will hereinafter be defined as a minimum separation distance for convenience of description. Such a minimum separation distance may further increase in a junction isolation structure in which impurities are used for device isolation.

However, if the gate is structured to surround the source/drain regions as described above, the minimum separation distance can be sufficiently maintained and the formation region of the gate can be extended in size. As a result, the MOS capacitor based on some implementations of the disclosed technology may have a larger capacitance. In other words, in some implementations, if the MOS capacitor having the same capacitance are formed, each of the MOS capacitor can be relatively small in size, such that the MOS capacitor can also be formed in a smaller or narrower region.

The gate 112 of the conversion gain capacitor 110 may include an electrically conductive material such as polysilicon or metal. The impurity region 114 may be structured to receive a conversion gain signal ($S_{DCG}$) through conductive lines. Thus, the impurity region 114 may be coupled to an input node to receive the conversion gain signal ($S_{DCG}$) therethrough. The gate 112 is coupled to the floating diffusion regions FD1 and FD2 and the source/drain region of the reset transistor RX through conductive lines. Under this design, the floating diffusion regions FD1 and FD2 and the conversion gain capacitor 110 collectively to construct an effective single common floating diffusion node CFD. In some implementations, the conversion gain capacitor 110 can be used to adjust the capacitance of the common floating diffusion node CFD based on an adjustment to the conversion gain signal ($S_{DCG}$) applied to the impurity region 114 of the conversion gain capacitor 110. Since the common floating diffusion node CFD can have one of different capacitances as described above, the image sensing device implemented based on some embodiments of the disclosed technology can be placed in a low gain mode or a high gain mode by adjusting the conversion gain of the image sensing device.

The reset transistor RX may initialize each of the floating diffusion regions FD1 and FD2 to the pixel voltage ($V_P$) level in response to a reset signal.

The position where the source follower transistor DX and the selection transistor SX are formed and the position where the reset transistor RX and the conversion gain capacitor 110 are formed are illustrated in FIG. 2 by way of example. In another implementation, the reset transistor RX and the conversion gain capacitor 110 may also be formed in one region of the sub-pixel block PB_S1 along the Y-axis direction, and the source follower transistor DX and the selection transistor SX may also be formed in another region (i.e., a region between the sub-pixel blocks PB_S1 and PB_S2) located opposite to the one region where the reset transistor RX and the conversion gain capacitor 110 are formed. In some implementations, in the unit pixel block (PB), the transistors DX, SX, and RX and the conversion gain capacitor 110 may also be formed in one region of the sub-pixel blocks PB_S1 and PB_S2 along the X-axis direction.

Although the conversion gain capacitor 110 discussed above is among 8 shared pixels, it should be noted that the conversion gain capacitor 110 can also be among 4 shared pixels. For example, each unit pixel block (PB) may include the pixel transistors DX, SX, and RX, the conversion gain capacitor 110, and the sub-pixel block PB_S1.

Figure 5A:
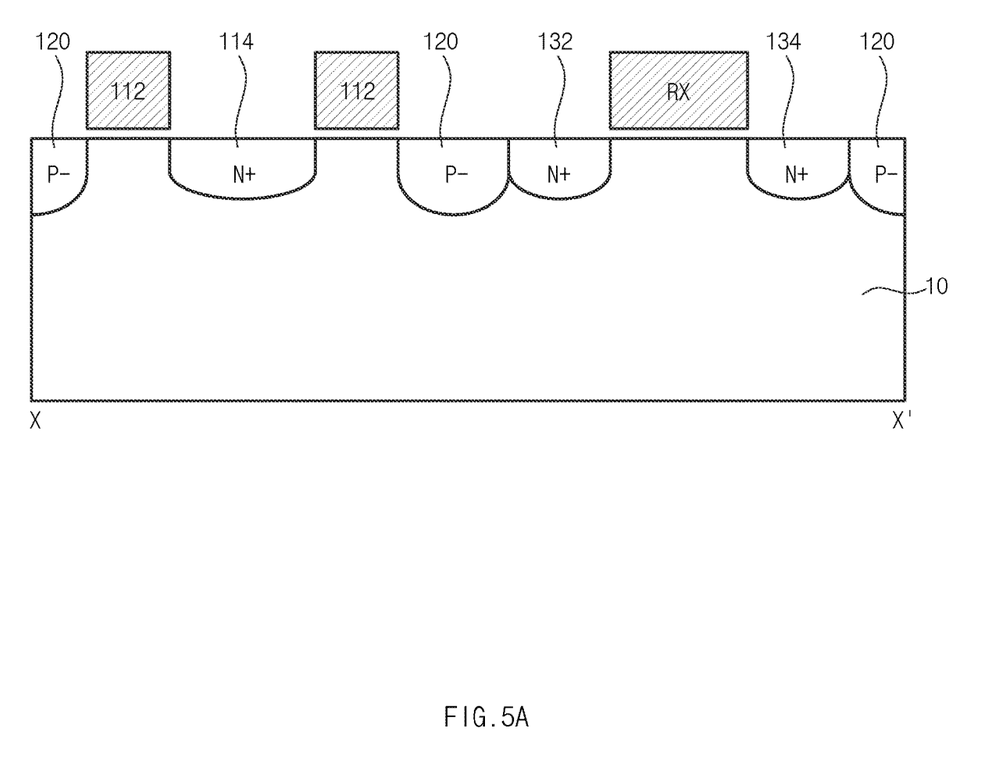
FIG. 5A is a cross-sectional view illustrating an example of a unit pixel block taken along the line X-X' shown in FIG. 2 based on some implementations of the disclosed technology.
Figure 5B:
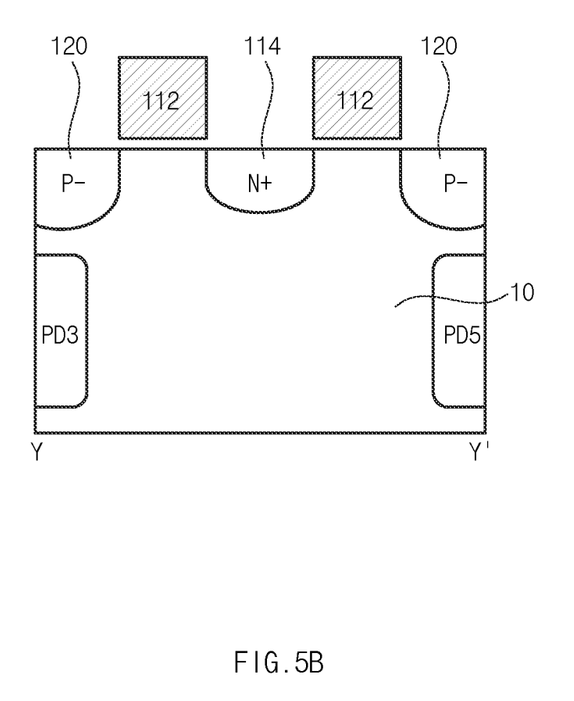
FIG. 5B is a cross-sectional view illustrating an example of a unit pixel block taken along the line Y-Y' shown in FIG. 2 based on some implementations of the disclosed technology.

FIG. 5A is a cross-sectional view illustrating an example of the unit pixel block taken along the line X-X' shown in FIG. 2. FIG. 5B is a cross-sectional view illustrating an example of the unit pixel block taken along the line Y-Y' shown in FIG. 2.

Referring to FIGS. 5A and 5B, the substrate 10 including the unit pixel blocks (PBs) may include a first surface and a second surface facing or opposite to the first surface.

In some implementations, the conversion gain capacitor 110 and the reset transistor RX may be disposed between the sub-pixel blocks PB_S1 and PB_S2 on the first surface of the substrate 10. The conversion gain capacitor 110 may include an impurity region 114 formed at the first surface of the substrate 10 extending to a certain depth below the first surface of the substrate 10, and a gate 112 formed to surround the impurity region 114. Although the gates 112 shown in each of FIGS. 5A and 5B are separated from each other since FIGS. 5A and 5B illustrate cross sections, it should be noted that each gate 112 can also be a part of the ring shaped gate shown in FIG. 2. The source and drain regions 132 and 134 of the reset transistor RX may be formed at the first surface of the substrate 10 extending to a certain depth below the first surface of the substrate 10.

The conversion gain capacitor 110 and the reset transistor RX may be separated from each other by a device isolation structure 120. In this case, the device isolation structure 120 may include a junction isolation structure that is formed by implanting P-type impurities into an upper portion of the substrate 10.

Although not shown in FIGS. 5A and 5B, active regions in which the transistors TX, DX, and SX are formed may also be isolated from each other by the junction isolation structure. Therefore, in some implementations, a trench-shaped device isolation structure capable of isolating the conversion gain capacitor 110 and the transistors TX, DX, SX, and RX from each other may not be formed in the unit pixel block (PB).

As is apparent from the above description, the image sensing device based on some implementations of the disclosed technology can switch between a low-illuminance mode and a high-illuminance mode by adjusting a conversion gain, placing the image sensing device in a high gain mode or a low gain mode. In adjusting the conversion gain, the image sensing device based on some implementations of the disclosed technology use a conversion gain MOS capacitor that includes a ring-shaped gate that surrounds a source/drain region, thereby increasing capacitance without increasing the size of the conversion gain MOS capacitor.

Although a number of illustrative embodiments have been described, it should be understood that various modifications of the disclosed embodiments and other embodiments can be devised based on what is described and/or illustrated in this patent document.

What is claimed is:

1. An image sensing device comprising:
a pixel array including a plurality of unit pixel blocks each including a plurality of unit image sensing pixels arranged in the pixel array and structured to convert light into photocharges,
wherein each of the unit pixel blocks includes:
a first sub-pixel block including a first floating diffusion region structured to hold the photocharges and a plurality of unit image sensing pixels sharing the first floating diffusion region; and
a conversion gain capacitor arranged adjacent to one side of the first sub-pixel block, and structured to include an impurity region disposed in a substrate and coupled to an input node that receives a conversion gain signal, and a gate structured to surround at least a portion of a top surface of the impurity region over the substrate and coupled to the first floating diffusion region to change a gain of the first floating diffusion region in response to a change in the conversion gain signal.

2. The image sensing device according to claim 1, wherein:
the gate has a rectangular ring shape structured to surround the impurity region.

3. The image sensing device according to claim 1, wherein each of the unit pixel blocks further includes:
a second sub-pixel block configured to include a second floating diffusion region structured to hold the photocharges and coupled to the first floating diffusion region, and a plurality of unit image sensing pixels sharing the second floating diffusion region.

4. The image sensing device according to claim 3, wherein:
the conversion gain capacitor is disposed between the first sub-pixel block and the second sub-pixel block.

5. The image sensing device according to claim 3, wherein each of the unit pixel blocks further includes:
a reset transistor configured to initialize the first and second floating diffusion regions based on a reset signal.

6. The image sensing device according to claim 5, wherein:
the reset transistor is disposed adjacent to the conversion gain capacitor and between the first sub-pixel block and the second sub-pixel block.

7. The image sensing device according to claim 5, wherein each of the unit pixel blocks further includes:
a device isolation region structured to electrically isolate the conversion gain capacitor, the reset transistor, and the first floating diffusion region from each other.

8. The image sensing device according to claim 7, wherein:
the device isolation region includes an impurity region.

9. The image sensing device according to claim 1, wherein each of the unit image sensing pixels includes:
a photoelectric conversion element configured to generate photocharges by converting incident light; and
a transfer transistor configured to transmit the photocharges generated by the photoelectric conversion element to the first floating diffusion region based on a transmission signal.

10. The image sensing device according to claim 1, wherein each of the plurality of unit pixel blocks includes:
a plurality of unit image sensing pixels arranged to surround the first floating diffusion region while being spaced apart from each other by a predetermined distance.

11. An image sensing device comprising:
at least one photoelectric conversion element configured to generate photocharges by converting incident light;
a floating diffusion region configured to store the photocharges generated by the at least one photoelectric conversion element;

at least one transfer transistor configured to transfer the photocharges to the floating diffusion region based on a transmission signal; and a conversion gain capacitor coupled to the floating diffusion region to adjust capacitance associated with the floating diffusion region based on a conversion gain signal to switch between different conversion gain values, wherein the conversion gain capacitor includes:

an impurity region disposed in a substrate and configured to receive the conversion gain signal; and a gate structured to surround at least a portion of a top surface of the impurity region over the substrate and coupled to the floating diffusion region.

12. The image sensing device according to claim 11, wherein:

the gate has a rectangular ring shape structured to surround the impurity region.

13. The image sensing device according to claim 11, wherein the at least one transfer transistor includes:

a plurality of transfer transistors arranged to be mapped to at least one photoelectric conversion element to transfer photocharges generated by a corresponding photoelectric conversion element to the floating diffusion region.

14. The image sensing device according to claim 11, wherein the at least one transfer transistor includes:

a plurality of transfer transistors spaced apart from each other by a predetermined distance and arranged to surround the floating diffusion region.

15. The image sensing device according to claim 11, further comprising:

a reset transistor configured to initialize the floating diffusion region based on a reset signal.

16. The image sensing device according to claim 15, wherein:

the reset transistor is disposed adjacent to the conversion gain capacitor and is coupled to the gate through a conductive line.

17. The image sensing device according to claim 15, further comprising:

a device isolation region structured to electrically isolate the conversion gain capacitor, the reset transistor, and the floating diffusion region from each other.

18. The image sensing device according to claim 17, wherein:

the device isolation region includes an impurity region.

* * * * *